US009029268B2

(12) United States Patent
Peters et al.

(10) Patent No.: US 9,029,268 B2
(45) Date of Patent: May 12, 2015

(54) PROCESS FOR ETCHING METALS (71) Applicant: Dynaloy, LLC, Kingsport, TN (US)

(72) Inventors: Richard Dalton Peters, Kingsport, TN (US); Travis Acra, Ingalls, IN (US); Spencer Erich Hochstetler, Kingsport, TN (US); Kimberly Dona Pollard, Anderson, IN (US)

(73) Assignee: Dynaloy, LLC, Kingsport, TN (US)

( * ) Notice: Subject to any disclaimer, the term of this patent is extended or adjusted under 35 U.S.C. 154(b) by 0 days.

(21) Appl. No.: 13/682,988

(22) Filed: Nov. 21, 2012

(65) Prior Publication Data

US 2014/0141622 A1  May 22, 2014

(51) Int. Cl.
| | |
|---|---|
| *H01L 21/311* | (2006.01) |
| *H01L 21/48* | (2006.01) |
| *H01L 21/3213* | (2006.01) |
| *C23F 1/16* | (2006.01) |
| *C23F 1/18* | (2006.01) |
| *C23F 1/32* | (2006.01) |
| *C23F 1/44* | (2006.01) |

(52) U.S. Cl.
CPC ...... *H01L 21/31133* (2013.01); *H01L 21/4864* (2013.01); *H01L 21/4835* (2013.01); *H01L 21/32134* (2013.01); *C23F 1/16* (2013.01); *C23F 1/18* (2013.01); *C23F 1/32* (2013.01); *C23F 1/44* (2013.01)

(58) Field of Classification Search
CPC ............ H01L 21/4835; H01L 21/4864; H01L 21/67023; H01L 21/67075; B44C 1/227
USPC ............ 438/745, 749, 750, 754; 216/91, 103, 216/106
See application file for complete search history.

(56) References Cited

U.S. PATENT DOCUMENTS

| 3,734,874 A | 5/1973 | Kibler et al. |
| 3,779,993 A | 12/1973 | Kibler et al. |

(Continued)

FOREIGN PATENT DOCUMENTS

| CN | 1733818 A | 2/2006 |
| DE | 19539394 A1 | 4/1996 |

(Continued)

OTHER PUBLICATIONS

Ho et al.; "Wafer-Scale, Sub-5 nm Junction Formation by Monolayer Doping and Conventional Spike Annealing", Nano Letters, 2009, vol. 9, No. 2, pp. 725-730.

(Continued)

*Primary Examiner* — Binh X Tran
(74) *Attorney, Agent, or Firm* — Dannis V. Carmen (57) ABSTRACT Processes are described to etch metals. In an embodiment, a process may include contacting a substrate with a stripping solution to remove photoresist from the substrate to produce a stripped substrate. The stripped substrate may include a plurality of solder pillars and a plurality of metal-containing field regions disposed around the plurality of solder pillars. In an illustrative embodiment, the plurality field regions may include copper. Additionally, the process may include rinsing the stripped substrate to produce a rinsed substrate. The rinsed substrate may be substantially free of a Sn layer or a Sn oxide layer. Further, the process may include contacting the rinsed substrate with an etch solution that is capable of removing an amount of one or more metals from the plurality of field regions.

20 Claims, 2 Drawing Sheets (56) References Cited

U.S. PATENT DOCUMENTS

| | | | |
|---|---|---|---|
| 3,828,010 A | 8/1974 | Davis et al. |
| 3,873,668 A | 3/1975 | Melby |
| 3,888,891 A | 6/1975 | Smith et al. |
| 3,920,695 A | 11/1975 | Smith et al. |
| 3,963,744 A | 6/1976 | Smith et al. |
| 3,981,859 A | 9/1976 | Smith et al. |
| 4,038,293 A | 7/1977 | Smith et al. |
| 4,169,068 A | 9/1979 | Harita et al. |
| 4,233,196 A | 11/1980 | Sublett |
| 4,303,454 A | 12/1981 | Petterson et al. |
| 4,518,675 A | 5/1985 | Kataoka |
| 4,547,271 A | 10/1985 | Bharucha et al. |
| 4,744,834 A | 5/1988 | Haq |
| 4,770,713 A | 9/1988 | Ward |
| 4,818,588 A * | 4/1989 | Okabe et al. ............... 428/201 |
| 4,830,641 A | 5/1989 | White, Jr. et al. |
| 4,861,512 A | 8/1989 | Gosselink |
| 4,925,588 A | 5/1990 | Berrod et al. |
| 5,006,598 A | 4/1991 | Adams et al. |
| 5,008,273 A | 4/1991 | Schnorrenberg et al. |
| 5,091,103 A | 2/1992 | Dean et al. |
| 5,142,020 A | 8/1992 | Kud et al. |
| 5,182,043 A | 1/1993 | Morrall et al. |
| 5,218,042 A | 6/1993 | Kuo et al. |
| 5,233,010 A | 8/1993 | McGhee et al. |
| 5,252,737 A | 10/1993 | Stern et al. |
| 5,290,631 A | 3/1994 | Fleury et al. |
| 5,369,189 A | 11/1994 | Kim et al. |
| 5,415,807 A | 5/1995 | Gosselink et al. |
| 5,431,847 A | 7/1995 | Winston et al. |
| 5,436,312 A | 7/1995 | Exner et al. |
| 5,453,541 A | 9/1995 | Stern et al. |
| 5,496,491 A | 3/1996 | Ward et al. |
| 5,502,118 A | 3/1996 | Macholdt et al. |
| 5,508,229 A * | 4/1996 | Baker .......................... 438/614 |
| 5,543,488 A | 8/1996 | Miller et al. |
| 5,547,612 A | 8/1996 | Austin et al. |
| 5,552,495 A | 9/1996 | Miller et al. |
| 5,552,511 A | 9/1996 | Miller et al. |
| 5,554,312 A | 9/1996 | Ward |
| 5,571,876 A | 11/1996 | Miller et al. |
| 5,597,678 A | 1/1997 | Honda et al. |
| 5,602,089 A | 2/1997 | Pennaz |
| 5,605,764 A | 2/1997 | Miller et al. |
| 5,608,111 A | 3/1997 | Stern et al. |
| 5,612,304 A | 3/1997 | Honda et al. |
| 5,623,088 A | 4/1997 | Stern et al. |
| 5,648,324 A | 7/1997 | Honda et al. |
| 5,691,289 A | 11/1997 | Purcell et al. |
| 5,698,512 A | 12/1997 | Austin et al. |
| 5,709,940 A | 1/1998 | George et al. |
| 5,710,119 A | 1/1998 | Busch et al. |
| 5,728,671 A | 3/1998 | Rohrbaugh et al. |
| 5,750,489 A | 5/1998 | Garcia et al. |
| 5,767,048 A | 6/1998 | Obuse |
| 5,786,318 A | 7/1998 | Blokzijl et al. |
| 5,795,702 A | 8/1998 | Tanabe et al. |
| 5,798,323 A | 8/1998 | Honda et al. |
| 5,834,412 A | 11/1998 | Rohrbaugh et al. |
| 5,843,878 A | 12/1998 | Gosselink et al. |
| 5,863,881 A | 1/1999 | Vlasblom |
| 5,911,835 A | 6/1999 | Lee et al. |
| 5,962,388 A | 10/1999 | Sherry et al. |
| 5,965,319 A | 10/1999 | Kobayashi |
| 5,985,816 A | 11/1999 | Vlasblom |
| 5,989,353 A | 11/1999 | Skee et al. |
| 6,007,749 A | 12/1999 | Wang et al. |
| 6,060,547 A | 5/2000 | Canter et al. |
| 6,063,522 A | 5/2000 | Hamrock et al. |
| 6,071,868 A | 6/2000 | Kim et al. |
| 6,093,689 A | 7/2000 | Vlasblom |
| 6,127,097 A | 10/2000 | Bantu et al. |
| 6,137,010 A | 10/2000 | Joo et al. |
| 6,146,815 A | 11/2000 | Komatsu et al. |
| 6,162,890 A | 12/2000 | George et al. |
| 6,187,729 B1 | 2/2001 | Hayes et al. |
| 6,211,127 B1 | 4/2001 | Kim et al. |
| 6,239,094 B1 | 5/2001 | Goderis et al. |
| 6,240,933 B1 | 6/2001 | Bergman |
| 6,255,274 B1 | 7/2001 | Becherer et al. |
| 6,310,263 B1 | 10/2001 | Vlasblom |
| 6,319,835 B1 | 11/2001 | Sahbari et al. |
| 6,319,884 B2 | 11/2001 | Leduc et al. |
| 6,369,016 B1 | 4/2002 | Vlasblom |
| 6,372,410 B1 | 4/2002 | Ikemoto et al. |
| 6,399,273 B1 | 6/2002 | Yamada et al. |
| 6,406,969 B2 | 6/2002 | Kim et al. |
| 6,440,856 B1 | 8/2002 | Bessho et al. |
| 6,455,479 B1 | 9/2002 | Sahbari |
| 6,465,403 B1 | 10/2002 | Skee |
| 6,514,656 B1 | 2/2003 | Nakamura et al. |
| 6,551,973 B1 | 4/2003 | Moore |
| 6,566,322 B1 | 5/2003 | Brook et al. |
| 6,579,466 B1 | 6/2003 | David et al. |
| 6,579,688 B2 | 6/2003 | Steaffens et al. |
| 6,600,142 B2 | 7/2003 | Ryan et al. |
| 6,638,694 B2 | 10/2003 | Ikemoto et al. |
| 6,677,286 B1 | 1/2004 | Rovito et al. |
| 6,683,219 B2 | 1/2004 | DeLuca et al. |
| 6,797,682 B2 | 9/2004 | Hara et al. |
| 6,815,151 B2 | 11/2004 | Tanabe et al. |
| 6,821,352 B2 | 11/2004 | Rovito et al. |
| 6,825,156 B2 | 11/2004 | Lee et al. |
| 6,833,129 B2 | 12/2004 | Loffler et al. |
| 6,844,461 B2 | 1/2005 | DeLuca et al. |
| 6,846,748 B2 | 1/2005 | Chien et al. |
| 6,872,633 B2 | 3/2005 | Huang et al. |
| 6,878,500 B2 | 4/2005 | Rutter, Jr. et al. |
| 6,884,571 B2 | 4/2005 | Uenishi |
| 6,897,004 B2 | 5/2005 | Uenishi et al. |
| 6,916,772 B2 | 7/2005 | Zhou et al. |
| 6,943,142 B2 | 9/2005 | Egbe et al. |
| 6,949,495 B2 | 9/2005 | Suto et al. |
| 7,049,275 B2 | 5/2006 | Ikemoto et al. |
| 7,078,371 B2 | 7/2006 | Ikemoto |
| 7,091,165 B2 | 8/2006 | Jo et al. |
| 7,129,199 B2 | 10/2006 | Zhang et al. |
| 7,157,605 B2 | 1/2007 | Kim et al. |
| 7,166,362 B2 | 1/2007 | Kano |
| 7,183,245 B2 | 2/2007 | Moore |
| 7,198,681 B2 | 4/2007 | Nguyen et al. |
| 7,247,208 B2 | 7/2007 | Hsu |
| 7,256,165 B2 | 8/2007 | Bertrem et al. |
| 7,385,751 B2 | 6/2008 | Chen et al. |
| 7,393,819 B2 | 7/2008 | Hsu |
| 7,402,341 B2 | 7/2008 | Halahmi |
| 7,528,098 B2 | 5/2009 | Lee et al. |
| 7,615,377 B2 | 11/2009 | Lippard et al. |
| 7,687,447 B2 | 3/2010 | Egbe et al. |
| 7,772,174 B2 | 8/2010 | Satoh |
| 7,851,426 B2 | 12/2010 | Nishiwaki |
| 7,922,823 B2 | 4/2011 | Walker et al. |
| 7,923,423 B2 | 4/2011 | Walker et al. |
| 7,947,638 B2 | 5/2011 | Tamura et al. |
| 7,960,328 B2 | 6/2011 | Visintin et al. |
| 7,968,506 B2 | 6/2011 | Chou et al. |
| 7,968,507 B2 | 6/2011 | Lee et al. |
| 8,063,007 B2 | 11/2011 | Tamura et al. |
| 8,105,997 B2 | 1/2012 | Zhu et al. |
| 8,114,825 B2 | 2/2012 | Yokoi et al. |
| 8,227,394 B2 | 7/2012 | Zhu et al. |
| 8,263,539 B2 | 9/2012 | Phenis et al. |
| 8,309,502 B2 | 11/2012 | Quillen et al. |
| 2001/0014534 A1 | 8/2001 | Aoki et al. |
| 2002/0037819 A1 | 3/2002 | Sahbari |
| 2002/0127500 A1* | 9/2002 | Moon et al. ............... 430/329 |
| 2002/0162579 A1* | 11/2002 | Wang et al. ............... 134/26 |
| 2003/0138737 A1 | 7/2003 | Wakiya et al. |
| 2003/0199406 A1 | 10/2003 | Anzures et al. |
| 2003/0215754 A1 | 11/2003 | Lundy et al. |
| 2004/0038840 A1 | 2/2004 | Lee et al. |
| 2004/0081922 A1 | 4/2004 | Ikemoto et al. |
| 2004/0106532 A1 | 6/2004 | Yokoi et al. |
| 2004/0137379 A1 | 7/2004 | Ikemoto |

(56) References Cited

U.S. PATENT DOCUMENTS

| | | |
|---|---|---|
| 2004/0159335 A1 | 8/2004 | Montierth et al. |
| 2004/0159654 A1 | 8/2004 | Ryan et al. |
| 2004/0220065 A1 | 11/2004 | Hsu |
| 2004/0256358 A1 | 12/2004 | Shimizu et al. |
| 2004/0266912 A1 | 12/2004 | Aida et al. |
| 2005/0112769 A1 | 5/2005 | Lippard et al. |
| 2005/0130862 A1 | 6/2005 | Trouillet-Fonti et al. |
| 2005/0143365 A1 | 6/2005 | Kim et al. |
| 2005/0197265 A1 | 9/2005 | Rath et al. |
| 2005/0261152 A1* | 11/2005 | Carter et al. ............... 510/201 |
| 2006/0099346 A1 | 5/2006 | Martin et al. |
| 2007/0027052 A1 | 2/2007 | Yokoi et al. |
| 2007/0078072 A1 | 4/2007 | Yokoi et al. |
| 2007/0087546 A1* | 4/2007 | Wu et al. .................. 438/613 |
| 2007/0111912 A1 | 5/2007 | Phenis et al. |
| 2007/0289127 A1* | 12/2007 | Hurwitz et al. ............... 29/827 |
| 2008/0076688 A1 | 3/2008 | Barnes et al. |
| 2008/0163892 A1 | 7/2008 | Huang et al. |
| 2008/0230092 A1 | 9/2008 | Ko et al. |
| 2008/0242102 A1 | 10/2008 | Keating |
| 2009/0047609 A1 | 2/2009 | Atkinson et al. |
| 2009/0119979 A1 | 5/2009 | Mullen |
| 2009/0156452 A1 | 6/2009 | Mui et al. |
| 2009/0162537 A1 | 6/2009 | Kolics et al. |
| 2009/0163402 A1 | 6/2009 | George |
| 2009/0246700 A1 | 10/2009 | Sonokawa |
| 2010/0016202 A1 | 1/2010 | Mui et al. |
| 2010/0180917 A1 | 7/2010 | Tanaka et al. |
| 2010/0249181 A1 | 9/2010 | DeGoey et al. |
| 2010/0298605 A1 | 11/2010 | Hirose et al. |
| 2013/0273479 A9* | 10/2013 | Quillen et al. ............... 430/329 |

FOREIGN PATENT DOCUMENTS

| | | |
|---|---|---|
| EP | 0 267 540 B1 | 5/1987 |
| EP | 0 388 592 A2 | 9/1990 |
| EP | 1 091 254 A2 | 4/2001 |
| EP | 1 860 508 A2 | 11/2007 |
| GB | 573145 A | 11/1945 |
| JP | 07-28254 | 1/1995 |
| JP | 11-181494 | 7/1999 |
| JP | 2001312074 A | 11/2001 |
| JP | 2003-255565 A | 9/2003 |
| JP | 2004-093678 A | 3/2004 |
| JP | 2004-133153 A | 4/2004 |
| WO | WO 90/00579 A1 | 1/1990 |
| WO | WO 03/012024 A1 | 2/2003 |
| WO | WO 2010/110847 A2 | 9/2010 |
| WO | WO 2010/110848 A1 | 9/2010 |

OTHER PUBLICATIONS

Ho et al.; Controlled Nanoscale Doping of Semiconductors via Molecular Monolayers, Nature Materials, vol. 7, Jan. 2008, pp. 62-67.

Fedynyshyn, T. et al; "Changes in Resist Glass Transition Temperatures Due to Exposure"; Advances in Resist Materials and Processing Technology XXIV; Proceedings of SPIE, vol. 6519; pp. 65197-1 through 65197-12 (2007).

D'Amour, J. D. et al; "Modifications to Thermophysical Behavior in Ultrathin Polymer Films"; Advances in Resist Technology and Processing XX; Proceedings of SPIE, vol. 5039, pp. 996-1007 (2003).

SEMI S3-91, Jan. 23, 2009, Safety Guidelines for Heated Chemical Baths, http://www.etms2,com/safety/heatedchem.htm.

Morrison, Robert T., et al.; Organic Chemistry, 3d Ed.; Allyn & Bacon, Inc.; Boston, MA; Chapter 16, pp. 518-551 (Dec. 1973).

Schumacher, Kevin et al.; "Benefits of Waterless Photo Resist Stripping"; Future Fab International; 1997; pp. 207-209; vol. 1, issue $.

Eastman Presentation "New Cleaning Technology for Microelectronic & Semiconductor Manufacturing" dated Feb. 2009.

\* cited by examiner

PROCESS FOR ETCHING METALS

STATEMENT OF JOINT DEVELOPMENT

This invention was created pursuant to a joint development agreement between Eastman Chemical Co. and EV Group. The aforementioned joint development agreement was in effect on or before the date the claimed invention was made, and the claimed invention was made as a result of activities undertaken within the scope of the joint development agreement.

BACKGROUND

In wafer level packaging applications, solder is applied directly to wafers that have completed the fabrication of microelectronic devices, but have not been diced into individual chips. A polymeric photoresist is typically applied to a substrate as a mask to define the placement of solder onto wafers. After solder is deposited onto the wafer, the photoresist must be removed before the next step in the packaging process can occur. In some cases, a positive photoresist may be used. Exposure of the positive photoresist to actinic radiation may cause a chemical reaction resulting in a solubility increase in aqueous alkali that allows the positive photoresist to be dissolved and rinsed away with developer. In other cases, a negative photoresist may be used. When the negative photoresist is exposed to actinic radiation, cross-linking of the polymer may occur in the exposed regions while leaving unexposed regions unchanged. The unexposed regions may be subject to dissolution and rinsing by a suitable developer chemistry.

Due to the thickness and cross-linked nature of thick dry film negative photoresist, the removal of this material after solder deposition can be difficult. The typical process for removing thick dry film negative photoresist in wafer level packaging applications is immersion of the wafer in formulated organic solvent-based mixtures for extended periods of time, often longer than 1 hr. Typically, 25 wafers are immersed in a tank containing the formulated solvent-based mixture for a sufficient time to completely remove the photoresist film. After a sufficient period of time, the wafers are transferred to additional tanks for rinsing, where the rinsing media may include water or isopropanol. Additional wafers are then processed in the same tank reusing the same formulated mixture, and the process is repeated for as long as the formulated mixture is capable of sufficiently removing the photoresist completely from the wafer.

Often, immersion-based removal of photoresist results in Sn being extracted from the solder and causing a thin film containing Sn to be plated onto field metal on the substrate. In some cases, the Sn-containing film may cover at least a portion of the field metal. If the Sn-containing film is not removed, the field metal cannot be removed, which may cause device failure. The Sn-containing film is often removed from the field metal by a plasma-based etch process, which requires the use of an additional process step on an additional piece of equipment in between the photoresist removal step and the field metal etch step.

SUMMARY

In one embodiment, the disclosure is directed to a process that may include contacting a substrate with a stripping solution to remove photoresist from the substrate to produce a stripped substrate. In an embodiment, the stripped substrate may include a plurality of solder pillars and a plurality of metal-containing field regions disposed around the plurality of solder pillars. In a particular embodiment, the field regions may include copper. In another embodiment, the field regions may include titanium. Additionally, the process may include rinsing the stripped substrate to produce a rinsed substrate. The rinsed substrate may be substantially free of a Sn layer or a Sn oxide layer. Additionally, the process may include contacting the rinsed substrate with an etch solution that is capable of removing an amount of the one or more metals from the plurality of field regions.

In another embodiment, a process may include providing a substrate that includes a plurality of solder pillars and a plurality of field regions disposed around the plurality of solder pillars. The process may also include placing the substrate in an apparatus that includes a process bowl, where the process bowl is configured to hold the substrate. In addition, the process may include contacting the substrate with a stripping solution while the substrate is held by the process bowl. The stripping solution may be capable of removing photoresist from the substrate. Further, the process may include contacting the rinsed substrate with an etch solution after contacting the substrate with the stripping solution and while the substrate is held by the process bowl. The etch solution may be capable of removing an amount of metal from the plurality of field regions.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

This disclosure describes embodiments of processes to etch metals, such as copper, tungsten, chromium, nickel, aluminum, tantalum, gold, molybdenum, titanium, and alloys of these metals. In particular implementations, photoresist may be removed from a substrate in wafer level packaging applications without leaving behind a Sn layer or a Sn oxide layer on metal field regions of the substrate. Accordingly, the metal may be etched directly after rinsing the substrate and without conducting the plasma-based etch process that is typically used to remove the Sn oxide layer that forms on the field regions in conventional immersion-based photoresist removal processes. In some situations, after etching field metal from the substrate, additional metal may be etched from the substrate. For example, layers underneath the field metal that may also be etched include adhesion metal, barrier metal, or seed metal layers. Furthermore, the rinsing of the substrate that takes place before the metal etch may be conducted under conditions such that organic residues and Sn are not deposited onto the surface of the substrate. The lack of organic residues or Sn deposited on the surface of the substrate may improve the efficiency of the process because these materials can be difficult to remove.

In some instances, the processes utilized to etch metals on the substrate may be performed in an apparatus that includes a process bowl (also referred to herein as a "chuck") configured to hold the substrate. The substrate may be contacted by a number of substances while being held by the process bowl. For example, the substrate may be contacted by one or more photoresist removal stripping solutions, one or more rinse solutions, one or more etch solutions, or a combination thereof, while being held by the process bowl. Thus, metal on the substrate may be etched in the same process bowl that is used for the removal of photoresist.

The term "coating" is defined as a method for applying a film to a substrate such as spray coating, puddle coating, or slit coating. The term "release" or "releasing" relates to removal of the substance form the substrate and is defined to include dissolution of the substance. The term "residue" includes the photoresist residues before etching and etch residues that include the photoresist byproducts of the etching process, deposits on the solder caps, and other organometallic residues unless specific reference is made to the type of residue. The terms "stripping", "removing", and "cleaning" are used interchangeably throughout this specification. Likewise, the terms "stripping composition", "stripping solution", and "cleaning composition" are used interchangeably. The indefinite articles "a" and "an" are intended to include both the singular and the plural. All ranges are inclusive and combinable in any order except where it is clear that such numerical ranges are constrained to add up to 100%, and each range includes all the integers within the range. The terms "weight percent" or "wt %" mean weight percent based on the total weight of the composition, unless otherwise indicated.

Figure 1:
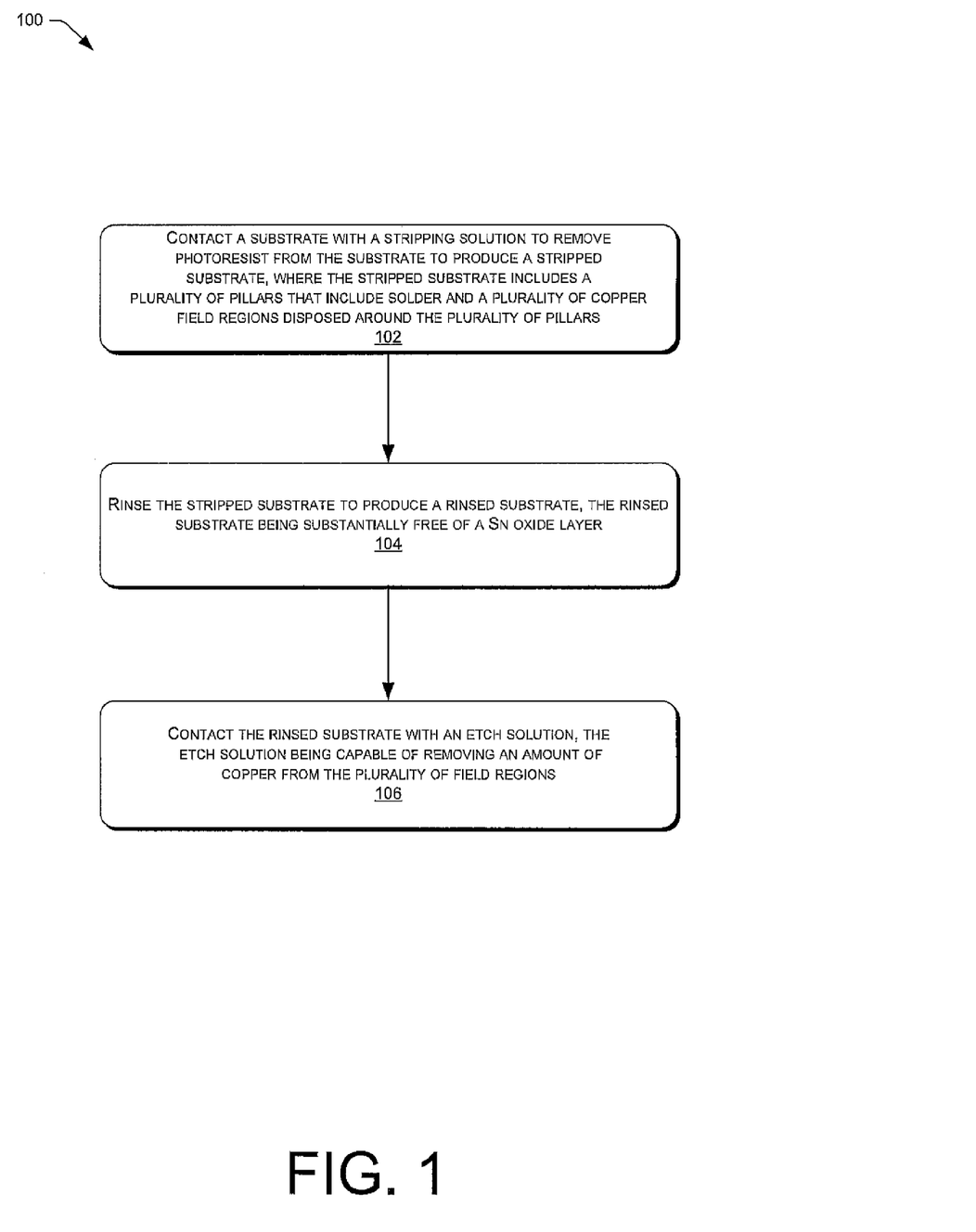
FIG. 1 is a flow diagram of an embodiment of a process to etch metals.

FIG. 1 is a flow diagram of an embodiment of a process 100 to etch metals. In one embodiment, metals may be etched from a substrate. The substrate may be an inorganic substrate, such as a silicon containing substrate, that includes one or more integrated circuits. In some cases, photoresist may be applied to the substrate in a wafer level packaging operation. In a particular embodiment, a thickness of the photoresist can be within a range of about 15 micrometers to about 125 micrometers. The photoresist on the substrate can include a number of patterned features, such as holes, lines, or both. In an embodiment, metal may be placed in the patterned features of the resist. In an illustrative embodiment, the metal may include Cu, Al, Au, or solder. In some scenarios, the solder may include an alloy of Pb and Sn, an alloy of Sn and Ag, or both. In a non-limiting illustrative embodiment, the patterned features may include Cu pillars with a solder cap. The substrate may also include a plurality of field regions that are disposed around and between the patterned features of the substrate. In a particular embodiment, the field regions may include one or more metals. Moreover, the one or more metals can include metals known by those of ordinary skill in the art as being useful in field regions or combinations of such metals. For example, the one or more metals include, but are not limited to copper, an alloy of copper, titanium, an alloy of titanium, tungsten, an alloy of tungsten, aluminum, an alloy of aluminum, nickel, an alloy of nickel, chromium, an alloy of chromium, tantalum, an alloy of tantalum, gold, an alloy of gold, molybdenum, an alloy of molybdenum, or a combination thereof. In some situations, metal on the substrate may be disposed in one or more layers. To illustrate, a copper-containing layer may be disposed on field regions of the substrate with a titanium-containing adhesion layer disposed beneath the copper-containing layer.

At 102, the process 100 includes contacting the substrate with a stripping solution to remove the photoresist from the substrate to produce a stripped substrate. In an embodiment, the stripping solution may be fresh, has not been used previously, and does not contain any recycled components. In another embodiment, the stripping solution may be re-used.

In one embodiment, the stripping solution may include solvent-based compositions that dissolve the targeted substance (e.g., photoresist) or cause the targeted substance to be released from the substrate. Non-limiting examples of the stripping solution may include, but are not limited to, compositions comprising a polar aprotic solvent, an amine, a quaternary ammonium hydroxide, or a combination thereof.

In an illustrative embodiment, the polar aprotic solvent may include dimethyl sulfoxide, dimethylformamide, dimethylacetamide, 1-formylpiperidine, dimethylsulfone, n-methylpyrrolidone, or mixtures thereof. In another illustrative embodiment, the amine may include ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, and 2-(2-aminoethoxy)ethanol, or mixtures thereof. In a further illustrative embodiment, the quarternary ammonium hydroxide may include tetramethylammonium hydroxide, tetramethylammonium hydroxide pentahydrate, tetrabutylammonium hydroxide, benzyltrimethylammonium hydroxide, tetrapropylammonium, dimethyldipropylammonium hydroxide, tetraethyl ammonium hydroxide, dimethyldiethyl ammonium hydroxide or mixtures thereof. The stripping solution may also include additives, such as metal corrosion inhibitors, surfactants, or both.

In an embodiment, contacting the substrate with the stripping solution can include providing a volume of the stripping solution to a particular side of the substrate that includes the photoresist. In some cases, providing the volume of the stripping solution to the substrate may include coating the particular side of the substrate with the stripping solution. According to an embodiment, the substrate may be coated with the stripping solution by spin-coating, spray coating, puddle coating, or slit coating. Spin-coating the stripping solution may include dispensing the stripping solution at the center of the substrate, and rotating the substrate at a speed of 100 rotations per minute (rpm) or less. In other embodiments, the delivery of the stripping solution to the substrate may be performed by a static method, whereby the fluid may puddle onto the surface of the substrate.

The volume of the stripping solution may be sufficient to coat at least a portion of a side of the substrate that includes the photoresist. According to other embodiments, the volume of the stripping solution may be sufficient to coat the entire side of the wafer that includes the photoresist. In a particular embodiment, an amount of the stripping solution for a 300 mm wafer may be at least 100 mL, at least 150 mL, at least 175 mL, at least 190 mL, or at least 205 mL. In another particular embodiment, an amount of the stripping solution for a 300 mm wafer may be no greater than 400 mL, no greater than 350 mL, no greater than 300 mL, no greater than 250 mL, no greater than 235 mL, or no greater than 220 mL. In an illustrative embodiment, an amount of the stripping solution for a 300 mm wafer may be within a range of about 75 mL to about 500 mL or within a range of about 150 mL to about 250 mL.

In some cases, the volume of the stripping solution applied to the substrate may form a coating on the substrate that has a particular thickness. In one embodiment, the thickness of the coating may be substantially uniform. In a particular embodiment, the thickness of the coating may be at least 1 mm, at least 1.5 mm, at least 2 mm, at least 2.5 mm, at least 3 mm, or at least 3.5 mm. In another particular embodiment, the thickness of the coating may be no greater than 5 mm, no greater than 4.5 mm, or no greater than 4 mm. In an illustrative embodiment, the thickness of the coating may be within a range of about 2 mm to about 3.25 mm.

In an embodiment, removing the photoresist from the substrate may also include heating the stripping solution, the substrate or both to a temperature that provides for the removal of the photoresist within a specified period of time. In one embodiment, the stripping solution may be heated by convective heating via placement of a heat source within a particular distance of the surface of the liquid. In another embodiment, the stripping solution may be heated through irradiation with infrared radiation. In a further embodiment, the stripping solution may be heated by conductive heating either through contacting the backside of the wafer with a heat source or directly contacting the stripping solution with the heat source.

In an embodiment, the stripping solution may be heated to a target temperature. In some instances, the stripping solution may be heated before contacting the substrate with the stripping solution. In other situations, the stripping solution may be heated after contacting the substrate with the stripping solution. In one embodiment, the stripping solution may be heated to a temperature below the flashpoint of the stripping solution. In another embodiment, the stripping solution may be heated to at least the flashpoint of the stripping solution. In another embodiment, the stripping solution may be heated to a temperature of at least 90° C., at least 95° C., or at least 100° C. In an additional embodiment, the stripping solution may be heated to a temperature of no greater than 105° C., no greater than 110° C., no greater than 115° C., or no greater than 120° C. In an illustrative embodiment, the stripping solution may be heated to a temperature within a range of about 95° C. to about 110° C.

In some scenarios, the temperature of the stripping solution may have a temperature variation from the target temperature of no greater than ±5° C., ±3° C., or ±2° C. The target temperature of the stripping solution may be maintained by manipulating a distance between the substrate and/or stripping solution and the heat source. In one embodiment, a heat source at a temperature within a range of about 200° C. to about 300° C. may be placed within a distance of the surface of the stripping solution within a range of about 0.5 mm to about 2.5 mm.

In an alternative embodiment, the stripping solution may not be subjected to heating and may be maintained on the substrate at ambient or room temperature. For example, the temperature of the stripping solution may be within a range of about 15° C. to about 25° C. The substrate may be coated with the stripping solution at ambient temperature for a duration sufficient to allow for the dissolution of the photoresist or the release of the photoresist from the substrate.

In some cases, the stripping solution may be heated for a duration of at least 2 minutes, at least 3 minutes, at least 4 minutes, or at least 5 minutes. Additionally, the stripping solution may be heated for a duration of no greater than 10 minutes, no greater than 8 minutes, or no greater than 6 minutes. In an illustrative embodiment, the stripping solution may be heated for a duration within a range of about 6 minutes to about 9 minutes.

Further, the substrate may be rotated while substrate is contacted with the stripping solution. For example, the substrate may be rotated at a speed of at least 5 rpm, at least 12 rpm, or at least 15 rpm. In another example, the substrate may be rotated at a speed of no greater than 25 rpm, no greater than 20 rpm, or no greater than 18 rpm. In an illustrative example, the substrate may be rotated at a speed within a range of about 10 rpm to about 20 rpm.

In an embodiment, after the substrate has been contacted with the stripping solution for a particular duration, the substrate may be agitated via mechanical, sonic, and/or electrical force. In a particular embodiment, the substrate is mechanically agitated by rotating the substrate at a target speed that is sufficient to fling off or otherwise substantially remove the stripping solution and the released and/or dissolved photoresist. According to some embodiments, the substrate may be rotated at a speed within a range of about 50 rpm to about 2000 rpm, within a range of about 100 rpm to about 1000 rpm, or within a range of about 150 rpm to about 500 rpm. In an illustrative embodiment, the substrate may be accelerated at 200 rpm/sec to achieve the target speed.

At 104, the process 100 may include rinsing the substrate to produce a rinsed substrate. The rinsed substrate may be substantially free from a Sn layer or Sn oxide layer. The rinsed substrate may also be substantially free from residual photoresist, residual Sn, or both. By producing a substrate that is free of a Sn layer or a Sn oxide layer on the substrate and free of any residual photoresist and/or residual Sn on the substrate, the embodiments described herein provide a process that is more efficient and cost effective than conventional wafer level packaging processes because there is no need to perform additional operations to remove these substances from the substrate.

The conditions for rinsing the substrate may be selected to prevent areas of the substrate from becoming dry during the rinsing process. For example, if the wafer rotates at a particular speed or rotates for a particular amount of time at a particular speed, a thickness of the liquid on the surface of the substrate may decrease such that portions of the wafer may become dry and/or residues may deposit on the surface of the wafer. The residues may include organic residues, dissolved photoresist, or metals, such as Sn, that are dissolved in the rinse media.

In one embodiment, the substrate may be rinsed with one or more rinsing agents. As used herein, the term "rinsing agent" includes any solvent that removes the stripping composition, other solution (e.g. aqueous acid or aqueous base solution) and/or released substance to be stripped. One or more of the rinsing agents or a particular combination of the rinsing agents may have an interfacial energy with the substrate surface that leads to a liquid-surface contact angle that is sufficiently low to prevent de-wetting of the surface of the substrate. In some cases, a surfactant may be added to a particular rinsing agent to reduce the interfacial energy between one or more of the rinsing agents and the substrate.

Examples of rinsing agents include, but are not limited to, water, pH modified water, deionized water, acetone, alcohols, for example, isopropyl alcohol and methanol, Dimethylsulfoxide (DMSO), and N-methylpyrrolidone (NMP). Rinsing agents can also include mixtures including surfactants such as, for example, Glycol Palmitate, Polysorbate 80, Polysorbate 60, Polysorbate 20, Sodium Lauryl Sulfate, Coco Glucoside, Lauryl-7 Sulfate, Sodium Lauryl Glucose Carboxylate, Lauryl Glucoside, Disodium Cocoyl Glutamate, Laureth-7 Citrate, Disodium Cocoamphodiacetate, nonionic Gemini surfactants including, for example, those sold under the tradename ENVIROGEM 360, nonionic fluorosurfactants including, for example, those sold under the tradename Zonyl FSO, ionic fluorinated surfactants including, for example, those sold under the tradename Capstone FS-10, Oxirane polymer surfactants including, for example, those sold under the tradename SURFYNOL 2502, and poloxamine surfactants, including, for example, those sold under the tradename TETRONIC 701, and mixtures thereof. Further, the rinsing agent can be water containing a sulfonated monomer or polymer in an amount ranging from less than 1% to the limit of solubility of the sulfonated monomer or polymer in the water. In one particular illustrative embodiment, a rinsing agent may include the stripping solution.

According to certain embodiments, rinsing the stripped substrate can include a number of rinsing operations. In some cases, the substrate may be rinsed with de-ionized water one or more times. In additional situations, rinsing the substrate may include contacting the substrate with an aqueous base solution, contacting the substrate with an aqueous acid solution, or both.

In an illustrative embodiment, rinsing the stripped substrate may include contacting the substrate with deionized water followed by contacting the substrate with an aqueous basic solution and then subjecting the substrate to an additional rinse with deionized water. The de-ionized water may be applied to the substrate via fan spray nozzles. Additionally, during the deionized water rinses, the substrate may be rotated at a speed of at least 50 rpm, at least 200 rpm, or at least 400 rpm while being contacted with the deionized water. Further, the substrate may be rotated at a speed of no greater than 2000 rpm, no greater than 1500 rpm, no greater than 1000 rpm, or no greater than 500 rpm while being contacted with the deionized water. In a particular illustrative embodiment, the substrate may be rotated at a speed within a range of about 300 rpm to about 700 rpm while being contacted with the deionized water. Additionally, the substrate may be contacted with deionized water for a duration within a range of about 2 seconds to about 30 seconds. In another embodiment, the substrate may be contacted with deionized water for a duration within a range of about 5 seconds to about 15 seconds.

In one embodiment, the aqueous basic solution may include at least one base, such as any alkali hydroxide including LiOH, NaOH, or KOH. In another embodiment, the aqueous basic solution may include any quarternary ammonium hydroxide including tetramethylammonium hydroxide, tetramethylammonium hydroxide pentahydrate, tetrabutylammonium hydroxide, benzyltrimethylammonium hydroxide, tetrapropylammonium, dimethyldipropylammonium hydroxide, tetraethyl ammonium hydroxide, dimethyldiethyl ammonium hydroxide or mixtures thereof.

In a particular embodiment, a normality of base in the aqueous basic solution may be at least 0.80N, at least 0.95N, at least 1.04N, at least 1.14N. In another particular embodiment, the normality of base in the aqueous basic solution may be no greater than 1.40N, no greater than 1.32N, no greater than 1.25N, or no greater than 1.19N. In an illustrative embodiment, the normality of the base in the aqueous basic solution may be within a range of about 0.95N to about 1.35N. In a particular embodiment, a volume of the aqueous basic solution applied to a 300 mm wafer may be at least 50 mL, at least 100 mL, or at least 150 mL. In another particular embodiment, a volume of the aqueous basic solution applied to a 300 mm wafer may be no greater than 175 mL, no greater than 200 mL, or no greater than 250 mL.

Further, after or prior to contacting the substrate with an aqueous basic solution and subsequently rinsing with deionized water, in some embodiments, the substrate may be contacted by an aqueous acidic solution. In some scenarios, the aqueous acidic solution may include at least one acid, such as a sulfonic acid including methanesulfonic acid, ethanesulfonic acid, ethane disulfonic acid, propanesulfonic acid, butanesulfonic acid, pentanesulfonic acid, hexanesulfonic acid, heptane sulfonic acid, dodecanesulfonic acid, benzenesulfonic acid, toluenesulfonic acid, 2-hydroxyethane-sulfonic acid, alkyl phenol sulfonic acids, chlorosulfonic acid, fluorosulfonic acid, bromosulfonic acid, 1-naphthol-4-sulfonic acid, 2-bromoethanesulfonic acid, 2,4,6-trichlorobenzenesulfonic acid, phenylmethanesulfonic acid, trifluoromethanesulfonic acid, cetylsulfonic acid, dodecylsulfonic acid, 2-, 3-, or 4-nitrobenzenesulfonic acid, di-nitrobenzenesulfonic acid, trinitrobenzenesulfonic acid, benzene-1,4-disulfonic acid, methyl-4-nitrobenzenesulfonic acid, methyldichlorobenzene sulfonic acid or mixtures thereof. In another embodiment, the acid may include sulfuric acid, phosphoric acid, hydrochloric acid, or nitric acid. In a particular embodiment, an amount of acid in the aqueous acidic solution may be at least 3 wt % for a total weight of the aqueous acidic solution, at least 5 wt % for a total weight of the aqueous acidic solution, or at least 7 wt % for a total weight of the aqueous acidic solution. In another particular embodiment, an amount of acid in the aqueous acidic solution may be no greater than 90% for a total weight of the aqueous acidic solution, no greater than 75 wt % for a total weight of the aqueous acidic solution, no greater than 50 wt % for a total weight of the aqueous acidic solution, or no greater than 25 wt % for a total weight of the aqueous acidic solution. In an illustrative embodiment, an amount of acid in the aqueous acidic solution may be within a range of about 4 wt % to about 10 wt % for a total weight of the aqueous acidic solution. After contacting the substrate with the aqueous acidic solution, the substrate may be subjected to an additional rinse with deionized water. In a particular embodiment, a volume of the aqueous acidic solution applied to a 300 mm wafer may be at least 50 mL, at least 100 mL, or at least 150 mL. In another particular embodiment, a volume of the aqueous acidic solution applied to a 300 mm wafer may be no greater than 250 mL, no greater than 200 mL, or no greater than 175 mL.

In some embodiments, the substrate may be rotated at a particular speed when being contacted by the aqueous basic solution and/or when being contacted by the aqueous acidic solution. For example, the substrate may be rotated at a speed of at least 5 rpm, at least 10 rpm, or at least 15 rpm. In another example, the substrate may be rotated at a speed of no greater than 100 rpm, no greater than 50 rpm, or no greater than 20 rpm. In a particular illustrative example, the substrate may be rotated at a speed within a range of 2 rpm to about 20 rpm when being contacted by the aqueous basic solution and/or when being contacted by the aqueous acidic solution. In another particular embodiment, the substrate may be stationary when being contacted by the aqueous basic solution and/or when being contacted by the aqueous acidic solution. In a particular embodiment, the substrate is contacted by the aqueous basic solution and/or by the aqueous acidic solution for a period of time of at least 10 sec, at least 30 sec, or at least 45 sec. In another particular embodiment, the substrate is contacted by the aqueous basic solution and/or by the aqueous acidic solution for a period of time no greater than 120 sec, no greater than 90 sec, or no greater than 60 sec.

Additionally, in particular embodiments, the substrate may soak in the aqueous basic solution and/or the aqueous acidic solution after being rotated and contacted by the aqueous basic solution and/or the aqueous acidic solution. For example, after rotating the substrate while being contacted by the aqueous basic solution, the substrate may soak in the aqueous basic solution for a duration within a range of about 5 seconds to about 120 seconds or within a range of about 30 seconds to about 60 seconds. In another example, after rotating the substrate while being contacted by the aqueous acidic solution, the substrate may soak in the aqueous acidic solution for a duration within a range of about 5 seconds to about 120 seconds or within a range of about 30 seconds to about 60 seconds.

In particular embodiments, the substrate may be dried after being rinsed. A drying operation may include heat drying, spin drying, and/or gas contact, such contacting the substrate with an inert gas in a heated and/or pressurized environment (e.g., air knife). In one embodiment, the substrate may be dried by rotating the substrate at a speed within a range of about 500 rpm to about 2500 rpm or within a range of about 1250 rpm to about 1750 rpm. In an additional embodiment, the substrate may be dried by rotating the substrate for a duration within a range of about 5 seconds to about 45 seconds or within a range of about 15 seconds to about 25 seconds.

A drying operation may also include chemical drying via the application of an appropriate drying agent, such as isopropyl alcohol (IPA) or acetone. Chemical and physical drying techniques may be combined as appropriate. In one embodiment, the substrate is dried chemically by the application of IPA or acetone alone. In another embodiment, the substrate is dried chemically, followed by physical drying. In yet another embodiment, the substrate is chemically dried with, for example, IPA or acetone after physical drying. In an embodiment, the substrate may be rotated while being contacted by the IPA. For example, the substrate may be rotated at a speed within a range of about 50 rpm to about 2000 rpm for a duration within a range of about 10 seconds to about 25 seconds while the substrate is contacted with IPA.

According to one embodiment, the substrate may be subjected to multiple cycles of the operations 102 and/or 104 until the desired level of removal of the photoresist is achieved. Moreover, any of the operations may be deleted during subsequent cycles as needed. According to one embodiment, multiple cycles of the same stripping compositions and rinsing agents may be applied. According to another embodiment, multiple cycles may use different stripping compositions in one or more cycles and/or different rinsing agents in one or more cycles. In yet another embodiment, the heating profile in different cycles may be changed. When different chemical cycles are used, the apparatus holding the substrate may be cleaned between cycles, such as via rinsing with water. In an embodiment, after performing operations with respect to blocks 102 and/or 104, at least 80% of the surface of the substrate may be resist free, at least 84% of the surface of the substrate may be resist free, at least about 88% of the surface of the substrate may be resist free, or at least about 93% of the surface of the substrate may be resist free. In another embodiment, after performing operations with respect to blocks 102 and/or 104, substantially all of the surface of the substrate may be resist free, no greater than 99% of the surface of the substrate may be resist free, or no greater than 97% of the surface of the substrate may be resist free. In an illustrative embodiment, within about 94% of the surface of the substrate to within about 100% of the surface of the substrate may be resist free after operations described with respect to blocks 102 and 104.

At 106, the process 100 may include contacting the rinsed substrate with an etch solution. The etch solution may be capable of removing an amount of metal from field regions of the substrate. In one embodiment, the etch solution may include an acidic etch solution. In another embodiment, the etch solution may include a basic etch solution.

In one non-limiting illustrative embodiment, the etch solution may include hydrofluoric acid. In another non-limiting illustrative embodiment, the etch solution may include an aqueous solution of an acid and hydrogen peroxide. In one embodiment, the aqueous etch solution may include phosphoric acid with hydrogen peroxide, and in another embodiment, the aqueous etch solution may include sulfuric acid with hydrogen peroxide. For example, an amount of acid in the aqueous etch solution may be at least 0.5 wt % for a total weight of the etch solution, at least 2.5 wt % for a total weight of the etch solution, or at least 4.0 wt % for a total weight of the etch solution. In another example, an amount of acid in the etch solution may be no greater than 12 wt % for a total weight of the etch solution, no greater than 9 wt % for a total weight of the etch solution, or no greater than about 6 wt % for a total weight of the etch solution. In one particular illustrative example, an amount of acid in the etch solution may be within a range of about 2.0 wt % to about 6.5 wt % for a total weight of the etch solution. Additionally, an amount of hydrogen peroxide in the aqueous etch solution may be at least 0.05 wt % for a total weight of the etch solution, at least 0.1 wt % for a total weight of the etch solution, or at least 0.3 wt % for a total weight of the etch solution. Further, an amount of hydrogen peroxide in the etch solution may be no greater than 2 wt % for a total weight of the etch solution, no greater than 1 wt % for a total weight of the etch solution, or no greater than about 0.5 wt % for a total weight of the etch solution. In a particular illustrative example, an amount of hydrogen peroxide in the etch solution may be within a range of about 0.1 wt % to about 0.4 wt % for a total weight of the etch solution.

In a particular embodiment, contacting the rinsed substrate with the etch solution may include soaking the rinsed substrate in a particular volume of the etch solution. To illustrate, the volume of the etch solution may be within a range of about 50 mL to about 300 mL, within a range of about 75 mL to about 200 mL, or within a range of about 90 mL to about 150 mL. In another particular embodiment, contacting the rinsed substrate with the etch solution may include spraying or continuously dispensing the etch solution onto a surface of the rinsed substrate. In some cases, the etch solution may be unused, while in other instances, the etch solution may be recycled. In yet another particular embodiment, the rinsed substrate may be rotated while dispensing the etch solution onto the substrate. In these instances, the volume of the etch solution used for continuous spraying or dispensing may be within a range of about 100 ml to 2000 mL, within a range of about 200 mL to 1500 mL, or within a range of about 500 mL to 1000 mL. In an additional particular embodiment, contacting the rinsed substrate with the etch solution may include alternatively soaking the rinsed substrate followed by rotating the substrate to remove the etch solution and repeating the soaking and rotating operations multiple times until the metal is completely removed.

In an embodiment, a temperature of the etch solution is within a range of about 10° C. to about 35° C. Additionally, the substrate is contacted with the etch solution for a duration within a range of about 30 sec to about 20 minutes, within a range of about 1 minute to about 15 minutes, or within a range of about 1 minute to about 5 minutes. After applying the etch solution to the substrate, the substrate may be rinsed with deionized water and then dried.

Although the process 100 includes particular operations described with respect to blocks 102-106, the order in which the operations of the process 100 are described is not intended to be construed as a limitation, and any number of the described operations can be combined in any order and/or in parallel to implement the process 100. For example, in some cases, a surface of the substrate may include a plurality of metals. In this situation, the substrate may be contacted multiple times with at least one etch solution. In some cases, different etch solutions may be used to remove each of the metals from the substrate. To illustrate, a first etch solution may be capable of removing a first metal from a substrate and a second etch solution may be capable of removing a second metal from the substrate. In an illustrative example, the field regions of the substrate may include both copper and titanium. In this case, the substrate may be contacted with a first etch solution to remove the copper from the substrate and, subsequently, the substrate may be contacted with a second etch solution to remove the titanium from the substrate. In some situations, one or more rinse operations, one or more drying operations, or both, may precede the contacting of the substrate by the second etch solution.

Figure 2:
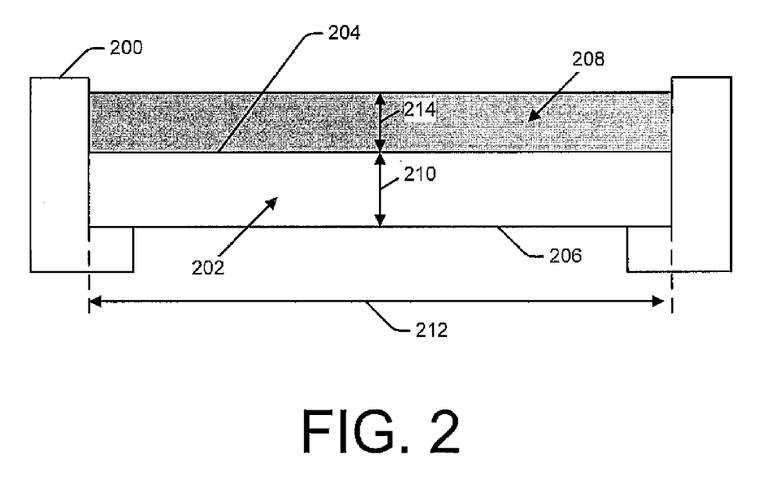
FIG. 2 illustrates a cross-sectional view of an embodiment of an apparatus that holds a substrate that includes a metal to be etched.

FIG. 2 illustrates a cross-sectional view of an embodiment of an apparatus 200 that holds a substrate 202. In some cases, the substrate 202 may be placed in the apparatus 200 by an operator of the apparatus 200, while in other situations, the substrate 202 may be mechanically placed in the apparatus 200. In a particular embodiment, the apparatus 200 may be configured to rotate the substrate 202. The substrate 202 may include a first side 204 and a second side 206. In an embodiment, the first side 204 includes one or more patterned features that are filled with a metal. Additionally, in some embodiments, the first side 204 may include photoresist that is to be removed according to embodiments described herein. The first side 204 may also include field metal that is disposed around and between the patterned features, where the field metal is to be etched according to embodiments described herein. In some cases, the first side 204 may include one or more metals disposed in layers on the field regions of the substrate 202. In one embodiment, the second side 206 may be in contact with air. In another embodiment, the second side 206 may be in contact with an insulating polymer, such as polyether ether ketone (PEEK) or polytetrafluoroethylene (PTFE).

In an embodiment, the apparatus 200 may hold a volume of liquid 208, such that the liquid 208 contacts the first side 204 of the substrate 202. Moreover, when such a chuck is employed, a portion of the stripping composition may come in contact with a portion of the second side 206 of the substrate 202, for example, via capillary action. In one embodiment, the liquid 208 may include one or more of the liquids described herein with respect to the process 100, such as a stripping solution, a rinsing agent, an etch solution, or a combination thereof.

The substrate 202 may include a thickness 210 and a width 212. In a particular embodiment, the substrate 202 includes a circular wafer and the width 212 is a diameter. In one embodiment, the thickness 210 of the substrate 202 is within a range of about 250 micrometers to about 950 micrometers, within a range of about 500 micrometers to about 800 micrometers, or within a range of about 700 micrometers to about 780 micrometers. Additionally, the width 212 of the apparatus 202 may be within a range of about 50 mm to about 450 mm, within a range of about 100 mm to about 350 mm, or within a range of about 200 mm to about 300 mm.

The liquid 208 can have a thickness 214. The thickness 214 may be proportional to the volume of the liquid 208 in the apparatus 202. In one embodiment, the thickness 214 may be within a range of about 0.5 mm to about 7 mm, within a range of about 1 mm to about 4 mm, or within a range of about 2 mm to about 3.5 mm. In some cases, the thickness 214 may be sufficient to remove particular substances from the substrate 202. For example, the thickness 214 may have values within a first range when removing photoresist from the substrate 202 and the thickness 214 may have values within a second range when etching metal from the field regions of the substrate 202. In another example, the thickness 214 may have values within a third range when rinsing the substrate with deionized water, the thickness 214 may have values within a fourth range when contacting the substrate 202 with an aqueous basic solution, and the thickness 214 may have values within a fifth range when contacting the substrate 202 with an aqueous acidic solution.

Furthermore, the volume of the liquid 208 held in the apparatus 200 may change as the dimensions of the substrate 202 change. To illustrate, when the substrate 202 is a circular wafer having a diameter of about 300 mm, the volume of the liquid 208 contained in the apparatus 200 can be within a range of about 50 mL to about 500 mL for certain operations described herein. In another illustration, when the substrate 202 is a circular wafer having a diameter of about 200 mm, the volume of the liquid 208 can be within a range of about 20 mL to about 250 mL for certain operations described herein. In a further illustration, when the substrate 202 is a circular wafer having a diameter of about 450 mm, the volume of the liquid 208 may be within a range of about 110 mL to about 1125 mL for certain operations described herein.

In an embodiment, the apparatus 200 may include a raised rim such that when the substrate 202 is placed on the apparatus 200, the rim is above the substrate thereby forming a process bowl. According to an embodiment the apparatus 200 may have a predominately circular ring with at least two distinct planes connected by a vertical member. Upon the first plane, the substrate 202 can be placed and only the circumferential edge of the substrate 202 is contacted. Backside edges around notches or flats that might be present in the substrate 202 are considered edges and may also make contact with this plane. The perimeter edge of the substrate 202 may or may not contact the vertical member of the apparatus 200. The second plane may be flush with or extending beyond the topside of first side 204 of the substrate 202. The apparatus 200 may also include a means to hold the first and second planes in position that serves to connect the apparatus 200 to a device that has the ability to rotate the apparatus 200. The apparatus 200 may be designed such that the separation between the first and second planes is proportional to the volume of the liquid 208 that can be contained by the apparatus 200. The apparatus 200 can include a protrusion in the vertical member which can serve to rotationally constrain the substrate 200 so that the rotational velocity of the substrate 200 matches the rotational velocities described herein with respect to the process 100.

In some embodiments, one or more of the operations described with respect to the process 100 may be performed while the substrate 202 is held in the apparatus 200, such that the process 100 is performed as a single-stage process. As used herein a "single stage process" refers to a process during which the substrate 202 remains in contact with a single substrate holder throughout the process. According to one embodiment, the holder may remain in a single cleaning chamber or "single bowl" throughout the process or it may rotate or move to one or more of a cleaning chamber, a rinsing chamber and a drying chamber. All unit operations (coating, heating, agitating, rinsing, drying, and other operations such as backside rinse) may be performed on the substrate 202 before the substrate 202 is removed from the process bowl. The substrate 202 may be processed such that once the substrate 202 is seated in the apparatus 200, all operations are performed until the total process is complete and then the substrate 202 is removed from the apparatus 200. Alternatively, the process may start once the substrate 202 is seated in the apparatus 200, and the substrate 202 may be unseated and reseated from the apparatus 200 for specific unit operations but remain in the single process module or single bowl until the total process is complete.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

EXAMPLES

Examples 1-5 concern the removal of a 120 μm thick TOK 50120 dry film negative photoresist from several 300 mm wafers with Sn/Ag solder pillars using different processes and/or different compositions for a stripping solution. Each wafer was processed on an EVG-301RS single wafer photoresist stripping equipment. Each wafer was placed in a chuck where ~96% of the surface area of the backside of the wafer was in contact with air, and the outer diameter of the chuck forms a liquid containment barrier around the perimeter of the wafer. The outer 3 mm radius of the backside of the wafer was in contact with the chuck. Each wafer was covered with 220 mL of the stripping solution. The inner radius of the chuck is ~4 mm larger than the outer radius of the wafer. The stripping composition fills the total inner diameter of the chuck, i.e., the stripping composition coats the entire top surface of the wafer and extends beyond the total diameter of the wafer to fill the total inner diameter of the chuck. Therefore, the thickness of the stripping composition on top of the wafer was ~2.95 mm. The stripping composition was then heated by bringing a heater at 250° C. into close proximity (~1 mm) of the liquid surface. In this manner, the liquid was heated by convective heating. During heating, the temperature was maintained by varying the separation distance between the heater and the liquid surface to control the liquid temperature to a target temperature. For examples 1-5, the target temperature for the stripping composition was 105° C. The total time in which heat was applied to the liquid was 8.5 min for examples 1-5. After 8.5 min, the heater was removed. Each wafer was then spun to fling off liquid from the surface of the wafer. To perform this fling-off step, the wafer was accelerated to 150 rpm at 200 rpm/sec followed by a delay of 1 sec. After the 1 sec delay, each wafer was rinsed with deionized water via fan spray nozzles while rotating at 500 rpm for 10 sec. For Examples 1-3 and 5, these wafers were then treated with a 1.14M aqueous solution of LiOH, where the wafer was coated with the LiOH solution while rotating at 10 rpm and allowed to sit for 30 sec. After 30 sec, the wafer was rinsed with deionized water while rotating at 500 rpm for 10 sec. All wafers, except Example 8, were then coated with a 7 wt % aqueous solution of methanesulfonic acid (MSA) while rotating at 10 rpm and allowed to sit for 30 sec. After 30 sec, the wafer was rinsed with deionized water while rotating at 500 rpm for 10 sec. Next, the wafer was rinsed with isopropanol while rotating at 500 rpm for 15 sec. Finally, the wafer was dried by spinning at 1500 rpm for 20 sec. After this process, the photoresist was completely removed from the wafer. The cleaning performance for photoresist removal was measured using a Rudolph NSX-100 optical inspection system. Post-resist strip yield, on a die basis, was recorded. After photoresist removal, each wafer was processed to etch the Cu field metal. Wafers were coated with 100 mL of an aqueous phosphoric acid and hydrogen peroxide mixture at room temperature. Wafers were allowed to sit for 20 min, then rinsed with deionized water and dried. The Cu field metal etch (FME) performance was measured using a Rudolph NSX-100 optical inspection system. Post-FME yield, on a die basis, was recorded. The Cu field metal etch was performed to investigate the Cu surface finish, but it is demonstrative of the capability for using the inventive process to remove photoresist or residue from a wafer and then performing additional wet processes to the same wafer using the same or similar process steps. For example, a wafer can undergo the inventive process to remove photoresist, and then after spin drying, the wafer can be coated with a wet etching solution to remove Cu field metal, then rinsed and dried. In this manner, multiple integration steps can be performed on one tool and in one process bowl.

For Examples 1 and 3-4, the post-resist strip yield was 86-87%, indicative of mostly complete resist removal. In all cases, the defects that resulted in yield loss were typically small residues. Examples 2 and 5 exhibited lower post-resist strip yield than Examples 1 and 3-4. For Examples 2 and 5, the increased defects that resulted in reduced yield were typically surface discoloration and not residue. Therefore, for Examples 1-5, the resist removal performance should be considered equivalent. However, the post-FME yield varied for Examples 1-5, which is more indicative of the real cleaning performance as well as the Cu field metal surface quality. Example 2 exhibited the highest yield after Cu field metal etch. Example 3 exhibited the worst yield.

TABLE 1

Stripping composition and process details used for Examples 1-5, and post-resist strip and post-FME NSX-100 yield results.

| Example | Stripping composition (wt %) | Process | Post-Resist Strip Yield | Post-FME Yield |
|---|---|---|---|---|
| 1 | 5% pTMAH, 23.75% DMAE, 71.23% DMSO, 0.02% Silbond-40 | After $1^{st}$ DIW rinse, treat with 1.14M LiOH, followed by $2^{nd}$ DIW rinse, followed by treatment with 7 wt % MSA, followed by $3^{rd}$ DIW rinse, and final rinse with IPA prior to spin drying | 87% | 79% |

TABLE 1-continued

Stripping composition and process details used for Examples 1-5, and post-resist strip and post-FME NSX-100 yield results.

| Example | Stripping composition (wt %) | Process | Post-Resist Strip Yield | Post-FME Yield |
|---|---|---|---|---|
| 2 | 5% pTMAH, 23.75% DMAE, 71.23% DMSO, 0.02% Silbond-40 | After 1$^{st}$ DIW rinse, treat with 1.14M LiOH, followed by 2$^{nd}$ DIW rinse, followed by treatment with 7 wt % MSA (including 0.2% Capstone FS-10), followed by 3$^{rd}$ DIW rinse, and final rinse with IPA prior to spin drying | 65% | 99% |
| 3 | 5% pTMAH, 23.75% DMAE, 71.25% DMSO | After 1$^{st}$ DIW rinse, treat with 1.14M LiOH, followed by 2$^{nd}$ DIW rinse, followed by treatment with 7 wt % MSA (including 0.005% Zonyl FSO), followed by 3$^{rd}$ DIW rinse, and final rinse with IPA prior to spin drying | 86% | 0% |
| 4 | 5% pTMAH, 23.75% DMAE, 71.23% DMSO, 0.02% Silbond-40 | After 1$^{st}$ DIW rinse, treat with 7 wt % MSA, followed by 2$^{nd}$ DIW rinse, and final rinse with IPA prior to spin drying | 87% | 41% |
| 5 | 5% pTMAH, 23.75% DMAE, 71.23% DMSO, 0.02% Silbond-40 | After 1$^{st}$ DIW rinse, treat with 1.14M LiOH, followed by 2$^{nd}$ DIW rinse, and final rinse with IPA prior to spin drying | 0% | 88% |

Silbond-40: 20% ethyl silicate, 3% ethanol, 77% ethyl polysilicates

What is claimed is:

1. A process, comprising:
   contacting a substrate with a stripping solution to remove photoresist from the substrate to produce a stripped substrate, wherein the stripped substrate includes a plurality of solder pillars and a plurality of metal-containing field regions disposed around the plurality of solder pillars, the solder pillars including Sn;
   rinsing the stripped substrate to produce a rinsed substrate, the rinsed substrate being substantially free of a Sn layer or a Sn oxide layer; and
   contacting the rinsed substrate with an etch solution, the etch solution being capable of removing an amount of one or more metals from the plurality of field regions.

2. The process of claim 1, wherein the etch solution is applied to the substrate at a temperature within a range of about 10° C. to about 35° C.

3. The process of claim 1, wherein the plurality of metal field regions include copper, a copper alloy, titanium, a titanium alloy, tungsten, an alloy of tungsten, aluminum, an alloy of aluminum, nickel, an alloy of nickel, chromium, an alloy of chromium, tantalum, an alloy of tantalum, gold, an alloy of gold, molybdenum, an alloy of molybdenum, or a combination thereof.

4. The process of claim 1, wherein an amount of etch solution contacting the rinsed substrate is within a range of about 50 ml to about 2000 ml.

5. The process of claim 1, wherein the etch solution contacts the rinsed substrate for a duration within a range of about 30 sec to about 20 minutes.

6. The process of claim 1, further comprising contacting the rinsed substrate with an additional etch solution, wherein the etch solution is capable of removing a first metal from the plurality of metal field regions and the additional etch solution is capable of removing a second metal from the plurality of field regions.

7. The process of claim 6, wherein a composition of the additional etch solution is different from a composition of the etch solution.

8. The process of claim 1, wherein the etch solution includes an acidic solution.

9. The process of claim 8, wherein the acidic solution includes an aqueous solution of phosphoric acid and hydrogen peroxide.

10. The process of claim 8, wherein the acidic solution includes hydrofluoric acid.

11. A process comprising:
    providing a substrate including a plurality of solder pillars and a plurality of field regions disposed between and around the plurality of solder pillars;
    placing the substrate in an apparatus that includes a process bowl, wherein the process bowl is configured to hold the substrate;
    contacting the substrate with a stripping solution while the substrate is held by the process bowl, the stripping solution being capable of removing photoresist from the substrate; and
    contacting the substrate with an etch solution to form a coating of the etch solution on the substrate, the substrate being contacted by the etch solution after contacting the substrate with the stripping solution and while the substrate is held by the process bowl, the etch solution being capable of removing an amount of metal from the plurality of field regions and the coating having a thickness from about 0.5 mm to about 7 mm.

12. The process of claim 11, wherein the contacting the substrate with an etch solution includes soaking the substrate in the etch solution for a duration within a range of about 30 seconds to about 20 minutes.

13. The process of claim 11, wherein the etch solution includes hydrogen peroxide.

14. The process of claim 11, wherein the contacting the substrate with the etch solution includes continuously dispensing the etch solution onto a surface of the substrate.

15. The process of claim 11, wherein a single side of the substrate is contacted by the stripping solution, the etch solution, or both.

16. The process of claim 11, further comprising rotating the substrate while contacting the substrate with the stripping solution at a speed of no greater than about 25 rpm.

17. The process of claim 11, further comprising contacting the substrate with an aqueous basic solution, an aqueous acidic solution, or both.

18. The process of claim 17, wherein a normality of base in the aqueous basic solution is within a range of about 0.95N to about 1.35N.

19. The process of claim 17, wherein the substrate is contacted with the aqueous acidic solution after contacting the substrate with the aqueous basic solution.

20. The process of claim 17, wherein the etch solution includes an amount of acid that is no greater than about 12 wt % for a total weight of the etch solution.

\* \* \* \* \*